United States Patent
Choi et al.

(10) Patent No.: US 9,105,359 B2
(45) Date of Patent: Aug. 11, 2015

(54) NONVOLATILE MEMORY DEVICE AND ERROR CORRECTION METHODS THEREOF

(71) Applicant: SAMSUNG ELECTRONICS CO., LTD., Suwon-Si, Gyeonggi-Do (KR)

(72) Inventors: Seonghyeog Choi, Hwaseong-si (KR); Junjin Kong, Yongin-si (KR); Changkyu Seol, Osan-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 215 days.

(21) Appl. No.: 13/788,592

(22) Filed: Mar. 7, 2013

(65) Prior Publication Data

US 2013/0326296 A1    Dec. 5, 2013

(30) Foreign Application Priority Data

Jun. 4, 2012   (KR) .......................... 10-2012-0059954

(51) Int. Cl.
*G11C 29/00* (2006.01)
*G11C 29/50* (2006.01)
*G06F 11/10* (2006.01)
*G11C 29/04* (2006.01)

(52) U.S. Cl.
CPC ...... *G11C 29/50004* (2013.01); *G06F 11/1048* (2013.01); *G11C 2029/0411* (2013.01)

(58) Field of Classification Search
CPC .......... G11C 29/5004; G11C 29/1048; G11C 29/0411
USPC .......................... 714/721, 752, 755, 758, 773
See application file for complete search history.

(56) References Cited

U.S. PATENT DOCUMENTS

| | | | |
|---|---|---|---|
| 8,259,506 B1 * | 9/2012 | Sommer et al. .......... 365/185.24 |
| 2008/0059868 A1 | 3/2008 | Cai et al. |
| 2010/0077279 A1 * | 3/2010 | Kim et al. ..................... 714/755 |
| 2010/0246286 A1 | 9/2010 | Kim et al. |
| 2010/0287447 A1 | 11/2010 | Eun et al. |
| 2011/0167318 A1 * | 7/2011 | Marelli et al. ............... 714/758 |
| 2011/0209031 A1 | 8/2011 | Kim et al. |
| 2013/0139035 A1 * | 5/2013 | Zhong et al. ................. 714/773 |

FOREIGN PATENT DOCUMENTS

KR    10-2010-0606109 A    10/2010

* cited by examiner

*Primary Examiner* — Sam Rizk
(74) *Attorney, Agent, or Firm* — Volentine & Whitt, PLLC

(57) ABSTRACT

A data processing method is provided for processing data read from a nonvolatile memory. The data processing method includes receiving first bit data from the nonvolatile memory at a memory controller, and performing erasure decoding based on the first bit data and second bit data stored in the memory controller. The first bit data indicates a memory cell that is erasure, and the second bit data is read using a read voltage during previous error correction decoding.

20 Claims, 8 Drawing Sheets

NONVOLATILE MEMORY DEVICE AND ERROR CORRECTION METHODS THEREOF

CROSS-REFERENCE TO RELATED APPLICATIONS

A claim for priority under 35 U.S.C. §119 is made to Korean Patent Application No. 10-2012-0059954, filed on Jun. 4, 2012, in the Korean Intellectual Property Office, the entire contents of which are hereby incorporated by reference.

BACKGROUND

The present inventive concept generally relates to nonvolatile memory devices and error correction data processing methods thereof.

With the increasing demand for high density semiconductor memory devices, multi-bit memory devices storing two or more bits in a single memory cell are becoming more widely used. In memory cells of a multi-bit flash memory device, for example, it is necessary to densely control each interval between threshold voltage distributions. However, threshold voltages of the memory cells shift over time and with repeated use of the memory device. Thus, the threshold voltage distributions of the memory cells gradually widen or spread due to loss and acquisition of charges. This spread of the threshold voltage distributions leads to increases in the number of errors included in read data. Various error correction decoding operations are performed on read data to enhance reliability of a semiconductor memory device. However, a decoding failure occurs when the number of error bits of error cells exceeds error correction capability. When a decoding failure occurs, error bit correction may be performed through erasure decoding. Repeatedly reading data from a nonvolatile memory is required to perform erasure decoding.

SUMMARY OF THE INVENTION

Embodiments of the inventive concept provide a nonvolatile memory device and error correction methods thereof.

According to an embodiment of the inventive concept, a data processing method is provided for processing data read from a nonvolatile memory. The method includes receiving first bit data from the nonvolatile memory at a memory controller, and performing erasure decoding based on the first bit data and second bit data stored in the memory controller. The first bit data indicates a memory cell that is erasure, and the second bit data is read using a read voltage during previous error correction decoding.

The first bit data may includes a bit indicating the memory cell that is erasure and a bit indicating a memory cell that is not erasure. The bit indicating the memory cell that is erasure and the bit indicating the memory cell that is not erasure may have different logical values.

The bit indicating the memory cell that is erasure may have a value of "0" and the bit indicating the memory cell that is not erasure has a value of "1." Or, the bit indicating the memory cell that is erasure may have a value of "1" and the bit indicating the memory cell that is not erasure may have a value of "0."

Performing erasure decoding may include generating erasure defined data based on the first bit data and the second bit data stored in the memory controller, and generating erasure decoded data from the erasure defined data using a decision algorithm.

The data processing method may further include performing error correction on the erasure decoded data. Generating the erasure decoded data may include converting all erasure bits of the first bit data into the same logical value, the error correction being performed on the converted erasure bits. Or, generating the erasure decoded data may include weighting each bit of the erasure defined data according to a log-likelihood ratio, the error correction being performed on the weighted erasure defined data.

According to another embodiment of the inventive concept, a data processing method is provided for processing data read from a nonvolatile memory. The method includes determining whether a read voltage used during previous error correction decoding is within a range of erasure threshold voltages; providing first bit data to a memory controller from the nonvolatile memory when the read voltage is within the range of the erasure threshold voltages; and performing erasure decoding based on the first bit data and second bit data stored in the memory controller when the read voltage is within the range of the erasure threshold voltages. The first bit data indicates a memory cell that is erasure, and the second bit data is read in correspondence to the read voltage during the previous error correction decoding.

The data processing method may further include performing erasure decoding based on the first erasure data and second erasure data when the read voltage is not within the range of the erasure threshold voltages. The first erasure data may be read using a highest voltage of the range of erasure threshold voltages, and the second erasure data may be read using a lowest voltage of the range of erasure threshold voltages.

The erasure location data may be read data using a lowest voltage of the range of erasure threshold voltages when a difference between the read voltage and a highest voltage of the range of erasure threshold voltages is within a reference value. The erasure location data may be read data using a highest voltage of the range of erasure threshold voltages when a difference between the read voltage and a lowest voltage of the range of erasure threshold voltages is within a reference value.

According to another embodiment of the inventive concept, a nonvolatile memory device includes a nonvolatile memory configured to store data and a memory controller configured to read data from the nonvolatile memory. The memory controller includes an erasure define unit configured to receive erasure location data indicating a memory cell of the nonvolatile memory that is erasure and to generate erasure defined data based on the erasure location data and previously stored pre-read bit data, and a decision decoder configured to perform decision decoding on the erasure defined data. The pre-read data is read using a read voltage during error correction decoding.

The decision decoder may perform the decision decoding by weighting each bit of the erasure defined data according to a log-likelihood ratio. Or, the decision decoder may perform the decision decoding by converting erasure bits of the erasure defined data into the same logical value.

The erasure location data may further include a bit indicating a memory cell of the nonvolatile memory that is not erasure. The bit indicating the location of the memory cell that is erasure and the bit indicating the memory cell that is not erasure may have different logical values.

The memory controller may receive the erasure location data from the nonvolatile memory device as a result of a comparison between the read voltage and a range of erasure threshold voltages during the error correction decoding. The memory controller may receive only the erasure location data from the nonvolatile memory when the read voltage is within the range of the erasure threshold voltages.

The memory controller may receive additional erasure location data from the nonvolatile memory when the read voltage is not within the range of the erasure threshold voltages, where the erasure location data is read using a highest voltage of the range of erasure threshold voltages, and the additional erasure location data is read using a lowest voltage of the range of erasure threshold voltages. The erasure defined data may be generated based on the erasure location data and the additional erasure location data.

The decision decoder may be further configured to perform error correction on the erasure decoded data.

BRIEF DESCRIPTION OF THE DRAWINGS

The various embodiments will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION

Figure 1:
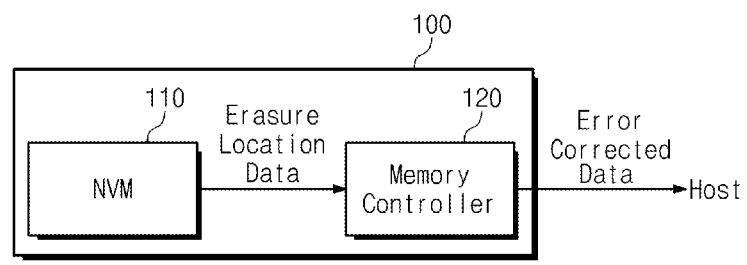
FIG. 1 is a block diagram of a memory device, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

While embodiments of the inventive concept are described with respect to a single bit memory cell having two states for purposes of convenience, it will be understood that the inventive concept is not limited thereto. An erasure decoding method according to embodiments of the inventive concept may be applied to a multi-bit memory cell having a multiple states.

Throughout the specification, the term "erasure bit" describes a bit having a logical state which is difficult to determine to be logic "0" or logic "1." The term "erasure" used herein thus refers to a third logical state, different from logic "0" and logic "1," during data processing.

Reference is made to FIG. 1, which is a block diagram of a memory device 100, according to an embodiment of the inventive concept. The memory device 100 includes a nonvolatile memory 110 and a memory controller 120.

The nonvolatile memory 110 may include, for example, a flash memory. Alternatively, the nonvolatile memory 110 may include a phase change random access memory (PRAM) or a resistive memory, such as a resistance random access memory (RRAM). Alternatively, the nonvolatile memory 110 may include a memory device using one of a nano floating gate memory (NFGM), a polymer random access memory (PoRAM), a magnetic random access memory (MRAM), and a ferroelectric random access memory (FRAM), for example.

Data provided from the memory controller 120 is stored in the nonvolatile memory 110. The data stored in the nonvolatile memory 110 may be stored in page units, for example. The memory controller 120 reads the data stored in the nonvolatile memory 110 in page units. The memory controller 120 is configured to correct errors included in the read data through error correction decoding using an error correction code. When there is an uncorrectable error in the data read from the nonvolatile memory 110, the memory controller 120 may selectively perform erasure decoding on the read data. The memory controller 120 transmits error-corrected data generated through the error correction decoding and/or the erasure decoding to a host. Therefore, even when there is an error that cannot be corrected through conventional error correction decoding, the memory device 100 of FIG. 1 may correct the error through erasure decoding using erasure location data input from the nonvolatile memory 110.

Figure 2:
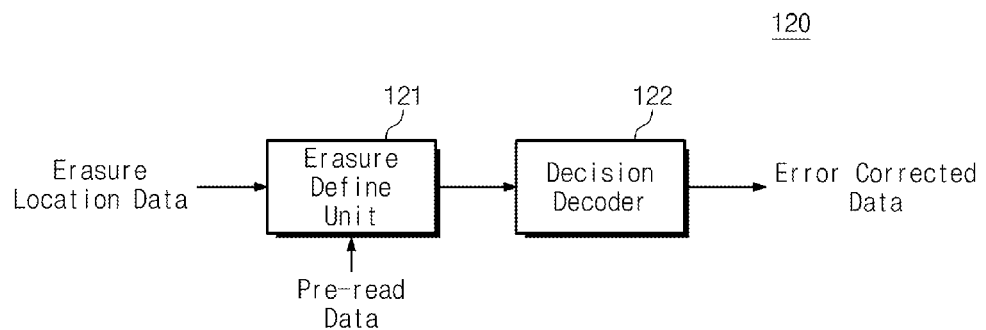
FIG. 2 is a block diagram of an example of a memory controller in FIG. 1, according to an embodiment of the inventive concept.

Reference is made to FIG. 2, which is a block diagram illustrating an example of the memory controller 120 in FIG. 1, according to an embodiment of the inventive concept. The memory controller 120 includes an erasure define unit 121 and a decision decoder 122. The memory controller 120 receives only one data stream, i.e., erasure location data, from the nonvolatile memory 110 (in FIG. 1) to perform the erasure decoding. Thus, reading time required during the erasure decoding may be reduced as compared to conventional techniques using multiple data streams from the nonvolatile memory.

The memory controller 120 reads data stored in the nonvolatile memory 110. The memory controller 120 performs error correction decoding on the read data. When there is an uncorrectable error in the data read from the nonvolatile memory 110, the memory controller 120 retains the read data as pre-read data and performs erasure decoding of the same.

The erasure define unit 121 receives erasure location data from the nonvolatile memory 110. The erasure define unit 121 also receives pre-read data retained in the memory controller 120. The pre-read data is data erased with a read voltage Vpre during the error correction decoding performed prior to the erasure decoding. The erasure define unit 121 generates erasure defined data based on the erasure location data and the pre-read data.

The decision decoder 122 performs decision decoding on the erasure defined data provided by the erasure define unit 121, and outputs an erasure decoded codeword on which error correction is performed to provide error-corrected data (or error-corrected codeword). A procedure of reading erasure location data of the nonvolatile memory 110 is described below in detail.

Figure 3:
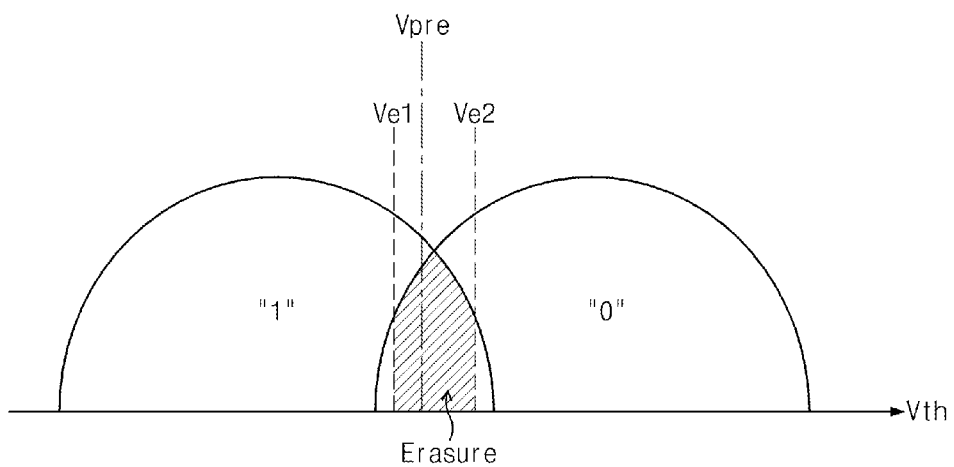
FIG. 3 illustrates a method of reading erasure location data, according to an embodiment of the inventive concept.

Reference is made to FIG. 3, which illustrates a method of reading erasure location data, according to an embodiment of the inventive concept. As discussed above, a threshold voltage of a memory cell spreads over time or repetition of program/erasure cycles (P/E cycles). That is, the threshold voltage of the memory cell decreases in read margin according to the influence of charge loss, program disturb, read disturb, and coupling from an initially programmed state, for example. As the threshold voltage spreads, each state of threshold voltage distribution may have an overlapping area.

If there is an overlapping area, an error may occur when the read voltage Vpre is applied, for example. That is, there may be error cells that are memory cells originally programmed to logic "0" but are read as logic "1" when they are sensed with the read voltage Vpre. Likewise, there may be error cells that are memory cells originally programmed to logic "1" but are read as logic "0" when they are sensed with the read voltage Vpre.

The memory controller 120 attempts to perform error decoding on the read data. A decoding failure occurs when the number of error bits of error cells exceeds error correction capability of the error correction decoding. When a decoding failure occurs, the memory controller 120 attempts to perform error bit correction through erasure decoding. In order to perform erasure decoding, erasure information is provided from the nonvolatile memory 110. As mentioned above, "erasure" does not mean logic "0" and logic "1" but means another logical state between logic "0" and logic "1" during data processing.

According to various embodiments, an erasure location detection method for read data is not limited. Erasure may be assigned to a location of column where a flip bit combination occurs through multiple read operations under different reading conditions. Alternatively, erasure may be assigned to a location of column where it is difficult to make major bit decision in a flip bit combination.

In an embodiment, interval read is used as the erasure location detection method for read data. The interval read method includes at least twice reading a page selected with read voltages Ve1 and Ve2 varying from a pre-read voltage Vpre. However, the interval read method is merely exemplary and the inventive concept is not limited thereto.

A procedure of detecting a location of erasure is now described. Memory cells are sensed using a first erasure read voltage Ve1, and then memory cells are sensed using a second erasure read voltage Ve2. A logical value of a memory cell, in which a logical value sensed with the first erasure read voltage Ve1 and a logical value sensed with the second erasure read voltage Ve2 are different from each other, is defined as erasure.

Erasure location data is generated from page data sensed with the first erasure read voltage Ve1 and the second erasure read voltage Ve2. The erasure location data is bit data indicating an erasure location for data read from the nonvolatile memory 110. For example, the erasure location data may be first bit data in which an erasure bit is represented as "0" and the other bits are represented as "1." Alternatively, the erasure location data may be first bit data in which an erasure bit is represented as "1" and the other bits are all represented as "0." However, this is merely exemplary and embodiments of the inventive concept are not limited thereto.

Referring again to FIG. 2, the erasure define unit 121 receives the erasure location data from the nonvolatile memory 110. Also the erasure define unit 121 receives the pre-read data retained in the memory controller 120. The pre-read data may be second bit data read using the read voltage Vpre during error correction performed previously to the erasure decoding.

The erasure define unit 121 generates erasure defined data based on the erasure location data and the pre-read data. The erasure defined data has three logical values, i.e., a logic value of "1," a logic value of "0," and a third logic value (i.e., erasure), as data values. A bit having the third logical value in the erasure defined data is defined as an erasure bit.

For example, a bit having the logical value of "1" in the erasure defined data is a bit determined not to be erasure but to be "true-1," among bits having a logical value of "1" in the pre-read data. That is, in this embodiment, a bit having the logical value of "1" in the erasure defined data is a bit determined to be a logical value of "1" when it is sensed with the first erasure read voltage Ve1.

A bit having the logical value of "0" in the erasure defined data is a bit determined not to be erasure but to be "true-0," among bits having a logical value of "0" in the pre-read data. That is, in this embodiment, the bit having the logical value of "0" in the erasure defined data is a bit determined to be a logical value of "0" when it is sensed with the second erasure read voltage Ve2.

The decision decoder 122 performs decision decoding on the erasure defined data. When a decision algorithm of the decision decoder 122 is a hard decision algorithm, for example, the decision decoder 122 performs decision decoding while regarding all erasures as "1" or "0." When the decision algorithm of the decision decoder 122 is a soft decision algorithm, for example, the decision decoder 122 performs decision decoding while putting weight on each bit according to a log-likelihood ratio (LLR) for each interval. Error correction is performed on the erasure decoded codeword output by the decision decoder 122 to provide error-corrected data.

The memory controller 120 according to the embodiment of the inventive concept described above with reference to FIG. 2 may correct an error through erasure decoding using erasure location data input from the nonvolatile memory 110 and pre-read data stored in the memory controller 120 even when the error cannot be corrected through conventional error correction decoding. The memory controller 120 in FIG. 2 uses pre-read data. Since the memory controller 120 may perform erasure decoding by receiving a single data stream, i.e., erasure location data, from the nonvolatile memory 110, reading time required during the erasure decoding may be reduced.

Figure 4:
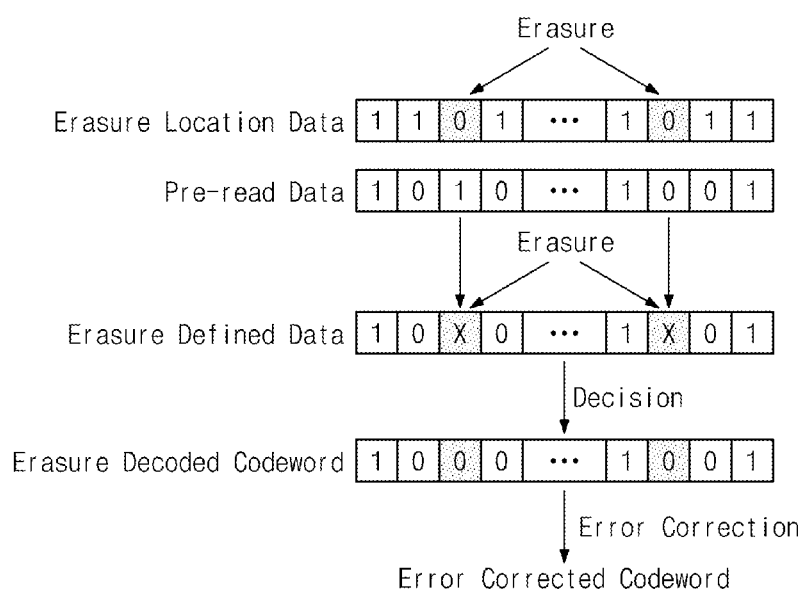
FIG. 4 illustrates erasure decoding, according to an embodiment of the inventive concept.

Reference is made to FIG. 4, which illustrates erasure decoding according to an embodiment of the inventive concept. Erasure location data is input from a nonvolatile memory. The erasure location data is data indicating the location of a bit having an erasure logical value in data read from the nonvolatile memory.

In this embodiment, the erasure location data is first bit data in which a bit corresponding to an erasure logical value has a logical value of "0" and a bit corresponding to the other logical values has a logical value of "1." In FIG. 4, bits corresponding to an erasure logical value is indicated by a hatched portion. However, this is merely exemplary and the inventive concept is not limited thereto.

A memory controller (e.g., memory controller 120 in FIG. 2) stores pre-read data, which is second bit data read during error correction decoding performed previously to erasure decoding. The memory controller 120 defines bits determined to be erasure through erasure location data from the pre-read data as erasure bits to generate erasure defined data.

The memory controller 120 performs decision decoding using a decision algorithm, based on the erasure defined data. For example, when the decision algorithm is a hard decision algorithm, the decision decoder performs decoding while regarding all erasure bits as "0" or "1." In the embodiment of FIG. 4, erasure decoding based on an all-0 hard decision algorithm is illustrated. That is, the decision decoder 122 regards all the erasure bits as "0" and generates an erasure decoded codeword, on which error correction is attempted, based on the error correction algorithm. However, this is merely exemplary and the inventive concept is not limited thereto.

In the erasure decoding method according to the embodiment of the inventive concept described above with reference to FIG. 4, the memory controller 120 receives only erasure location data from a nonvolatile memory (e.g., nonvolatile memory 110 in FIG. 1) and generates erasure defined data using the erasure location data together with pre-read data stored in the memory controller 120.

Since the erasure defined data has three logical values, two data streams are required conventionally to generate erasure defined data. For example, the erasure defined data may be generated through a data stream sensed with a first erasure read voltage Ve1 and a data stream sensed with a second erasure read voltage Ve2. However, this requires a memory controller to receive two data streams each time from a nonvolatile memory to generate erasure defined data of each page, which generally require long reading time during the erasure decoding.

In contrast, in the erasure decoding method according to embodiments of the inventive concept, only one data stream, i.e., erasure location data, from a nonvolatile memory is used, along with pre-read data stored in the memory controller. Thus, reading time during the erasure decoding is reduced.

Figure 5:
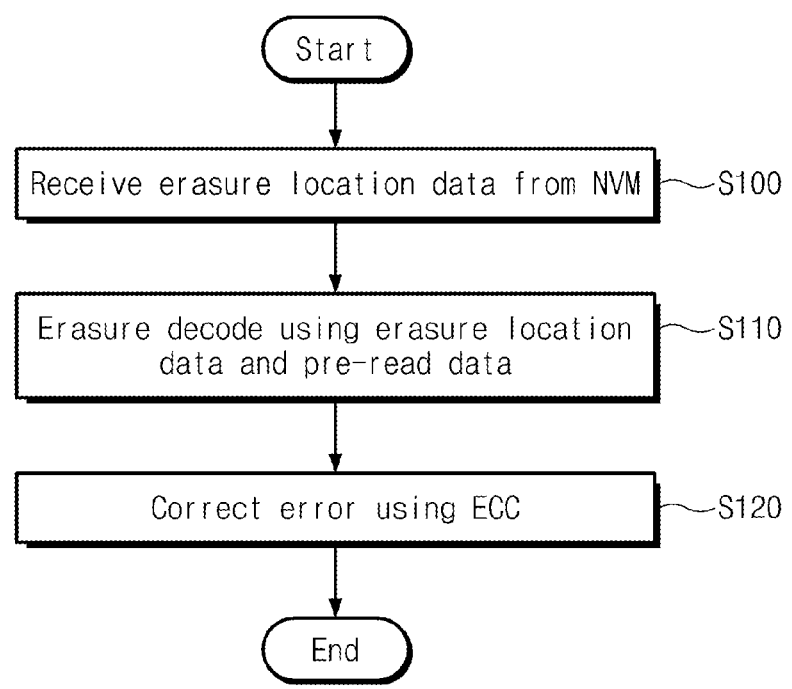
FIG. 5 is a flowchart illustrating a data processing method, according to an embodiment of the inventive concept.

Reference is made to FIG. 5, which is a flowchart illustrating a data processing method according to an embodiment of the inventive concept. A memory controller performs erasure decoding when error correction decoding on read data fails.

At step S100, erasure location data is received from a nonvolatile memory. As described above, the erasure location data is data indicating erasure locations for read data. At step S110, erasure decoding is performed using the erasure location data and the stored pre-read data input at step S100. The erasure decoding may include generating erasure defined data based on the erasure location data and the pre-read data, and performing decision decoding on the erasure defined data to provide an erasure decoded codeword. At step S120, error correction is attempted using an error correction algorithm, based on the erasure decoded codeword generated at the step S110. The error correction may be performed using various decision algorithms. For example, the error correction may be performed using a hard decision algorithm or a soft decision algorithm.

According to the data processing method described with reference to FIG. 5, a single data stream, i.e., erasure location data received from a nonvolatile memory by the memory controller, and pre-read data stored in the memory controller are used to perform erasure decoding. Thus, reading time during the erasure decoding is reduced.

Figure 6:
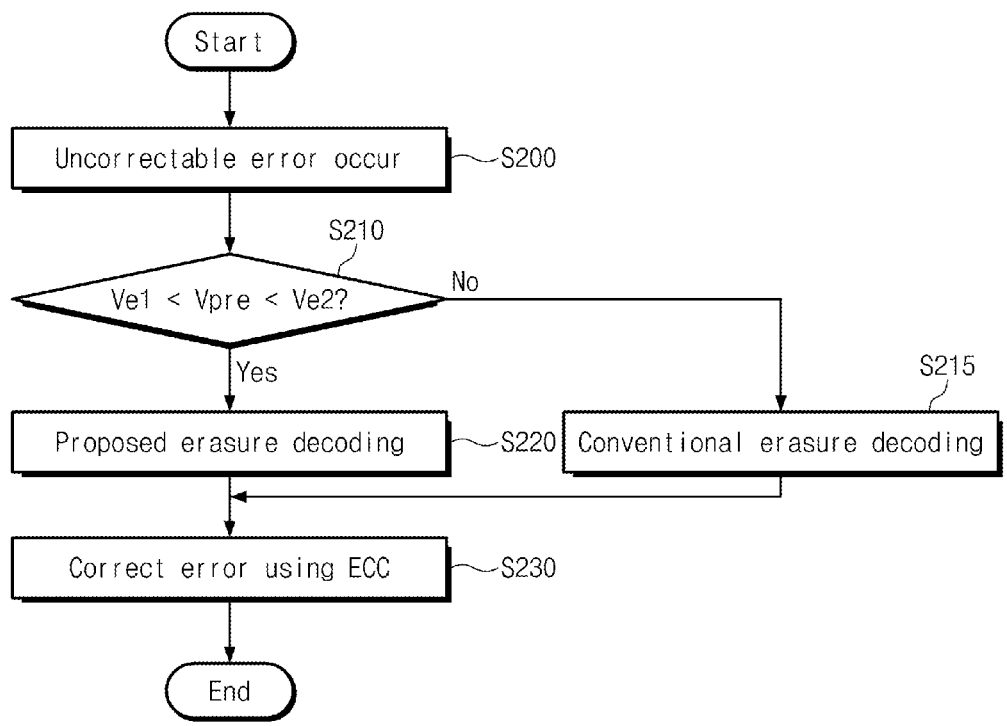
FIG. 6 is a flowchart illustrating a data processing method, according to another embodiment of the inventive concept.

Reference is made to FIG. 6, which is a flowchart illustrating a data processing method according to another embodiment of the inventive concept.

At step S200, a memory controller attempts to perform erasure decoding when correction decoding on read data fails. The memory controller 120 may specify the range of a threshold voltage to be determined to be erasure before performing the erasure decoding.

At step S210, the memory controller 120 determines whether a pre-read voltage Vpre sensing pre-read data is between a first erasure read voltage Ve1 and a second erasure read voltage Ve2 of the specified erasure. The first erasure read voltage Ve1 is the lowest threshold voltage of the range of threshold voltages to be determined to be erasure, and the second erasure read voltage Ve2 is the highest threshold voltage of the range of threshold voltages to be determined to be erasure.

When it is determined at step S210 that the pre-read voltage Vpre is not between the first and second erasure read voltages Ve1 and Ve2, meaning that the pre-read voltage Vpre is beyond the range of the threshold voltages to be determined to be erasure, conventional erasure decoding (i.e., two or more data streams are received from a nonvolatile memory device) is performed at step S215. Erasure decoded data is generated as a result of the erasure decoding.

When it is determined at step S210 that the pre-read voltage Vpre is between the first and second erasure read voltages Ve1 and Ve2, meaning that the pre-read voltage Vpre is within the range of the threshold voltages to be determined to be erasure, the disclosed erasure decoding (i.e., only one stream of erasure location data is received from a nonvolatile memory) is performed at step S220. Erasure defined data and erasure decoded data is generated as a result of the erasure decoding. At step S230, the memory controller 120 attempts to perform error correction based on the erasure decoded data generated at step S220 or step S215.

According to the data processing method described with reference to FIG. 6, erasure decoding is selectively performed using a single data stream from the nonvolatile memory depending on whether a pre-read voltage is within the range of threshold voltages to be determined to be erasure. Thus, accuracy of the erasure decoding is enhanced and reading time is reduced.

According to the above-described embodiments, a nonvolatile memory provides erasure location data to a memory controller to be combined with pre-read data. The erasure location data provided by the nonvolatile memory may vary depending on a pre-read voltage Vpre of the pre-read data. For example, when the pre-read voltage Vpre approaches the highest threshold voltage of the range of erasure, corresponding to the second erasure read voltage Ve2, within a constant reference value, the nonvolatile memory may provide read data sensed using the first erasure read voltage Ve1 (at the lowest threshold voltage of erasure) to the memory controller as erasure location data. Alternatively, when the pre-read voltage approaches the lowest threshold voltage of the range of erasure, corresponding to the first erasure read voltage Ve1, within a constant reference value, the nonvolatile memory may provide read data sensed using the second erasure read voltage Ve2 to the memory controller as erasure location data.

Figure 7:
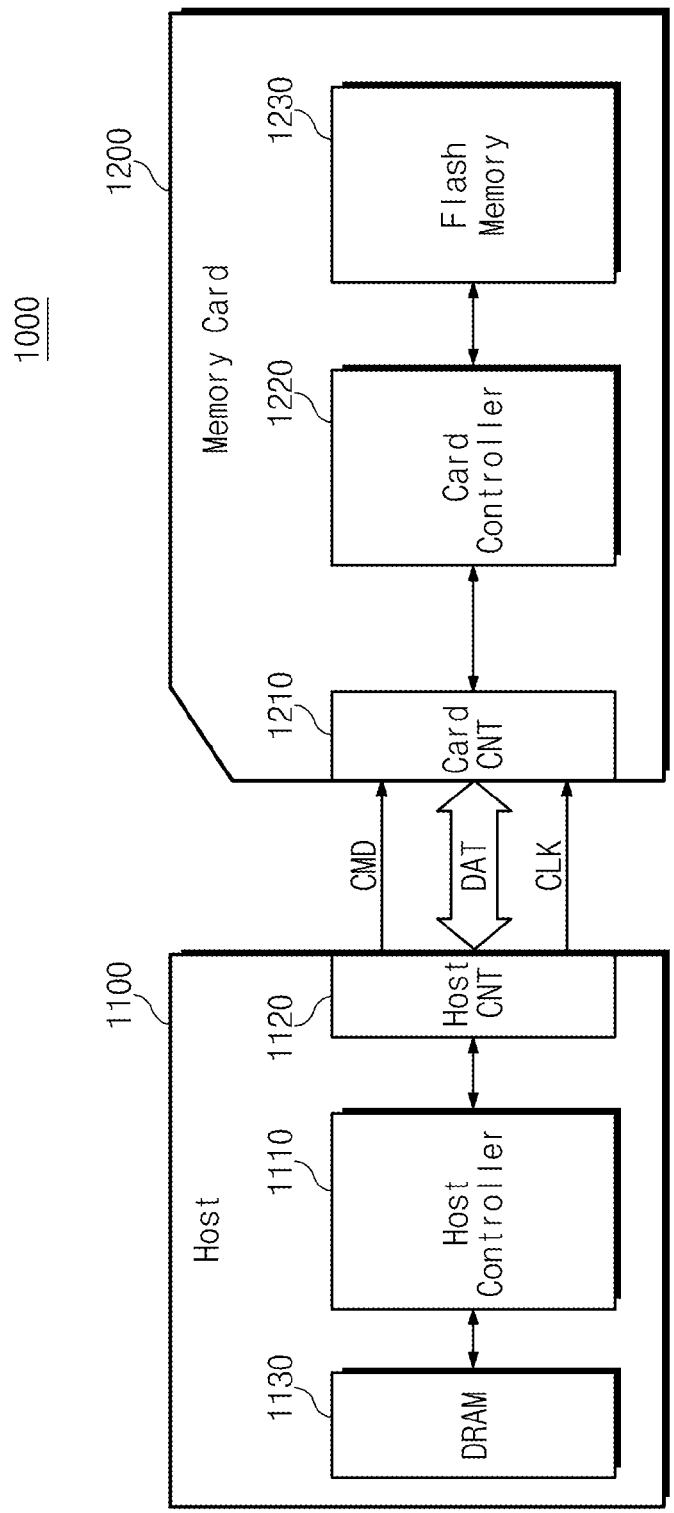
FIG. 7 is a block diagram illustrating a memory device included in a memory card system, according to an embodiment of the inventive concept.

Reference is made to FIG. 7, which is a block diagram illustrating an example in which a memory device according to an embodiment of the inventive concept is included in a memory card system 1000. The memory card system 1000 includes a host 1100 and a memory card 1200. The host 1100 includes a host controller 1110, a host connection unit 1120, and dynamic random access memory (DRAM) 1130.

The host 1100 writes data into the memory card 1200 or reads data stored in the memory card 1200. The host controller 1110 transmits a command (e.g., write command), a clock signal CLK generated by a clock generator (not shown) in the host 1100, and data DAT to the memory card 1200 through the host connection unit 1120. The DRAM 1130 is a main memory of the host 1100.

The memory card 1200 includes a card connection unit 1210, a card controller 1220, and a flash memory 1230. In response to a command received through the card connection unit 1210, the card controller 1220 stores data in the flash memory 1230 in synchronization with a clock signal generated by a clock generator (not shown) in the card controller 1220. The flash memory 1230 stores the data transmitted from the host 1100. When the host 1100 is, for example, a digital camera, the flash memory 1230 stores image data.

The memory system 1000 may perform erasure decoding by transmitting only one data stream to the card controller 1220 from the flash memory 1230 during reading of the data stored in the flash memory 1230. Thus, reading time required for the reassure decoding may be reduced.

Figure 8:
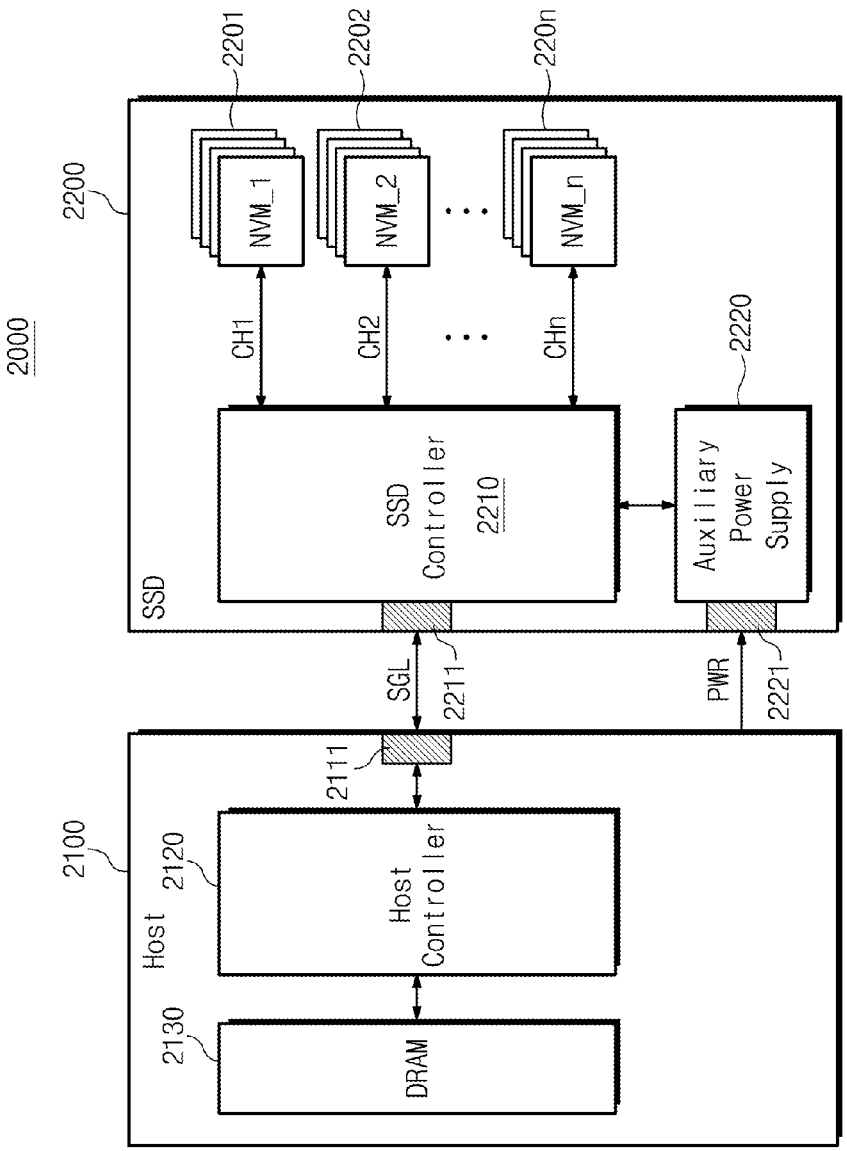
FIG. 8 is a block diagram illustrating a memory device included in a solid state drive (SSD) system, according to an embodiment of the inventive concept.

FIG. 8 is a block diagram illustrating an example in which a memory device according to an embodiment of the inventive concept is included in a solid state drive (SSD) system 2000. The SSD system 2000 includes a host 2100 and an SSD 2200. The host 2100 includes a host interface 2111, a host controller 2120, and DRAM 2130.

The host 2100 writes data into the SSD 2200 or reads data stored in the SSD 2200. The host controller 2120 transmits a command, an address, a signal SGL such as a control signal to the SSD 2200 through the host interface 2111. The DRAM 2130 is a main memory of the host 2100.

The SSD 2200 exchanges the signal SGL with the host 2100 through the host interface 2211. The SSD 2200 may include a plurality of nonvolatile memories 2201~220$n$, an SSD controller 2210, and an auxiliary power supply 2220. The nonvolatile memories 2201~220$n$ may be implemented as NAND flash memory, PRAM, MRAM, ReRAM, or FRAM, for example.

The nonvolatile memories 2201~220$n$ are used as a storage medium of the SSD 2200. The nonvolatile memories 2201~220$n$ may be connected to the SSD controller 2210 through a plurality of channels CH1~CHn. One or more nonvolatile memories may be connected to one channel. Memory devices connected to one channel may be connected to the same bus.

The SSD controller 2210 exchanges the signal SGL with the host 2100 through the host interface 2211. The signal SGL may include a command, an address and data. The SSD controller 2210 writes data into a corresponding memory device or reads data from the corresponding memory device according to a command from the host 2100. An illustrative internal configuration of the SSD controller 2210 will be described below with reference to FIG. 9.

The auxiliary power supply 2220 is connected to the host 2100 through a power connector 2221. The auxiliary power supply 2220 may be charged by power PWR provided by the host 2100. The auxiliary power supply 2220 may be disposed inside or outside the SSD 2200. For example, the auxiliary power supply 2220 may be disposed on a main board and supply auxiliary power to the SSD 2200

Figure 9:
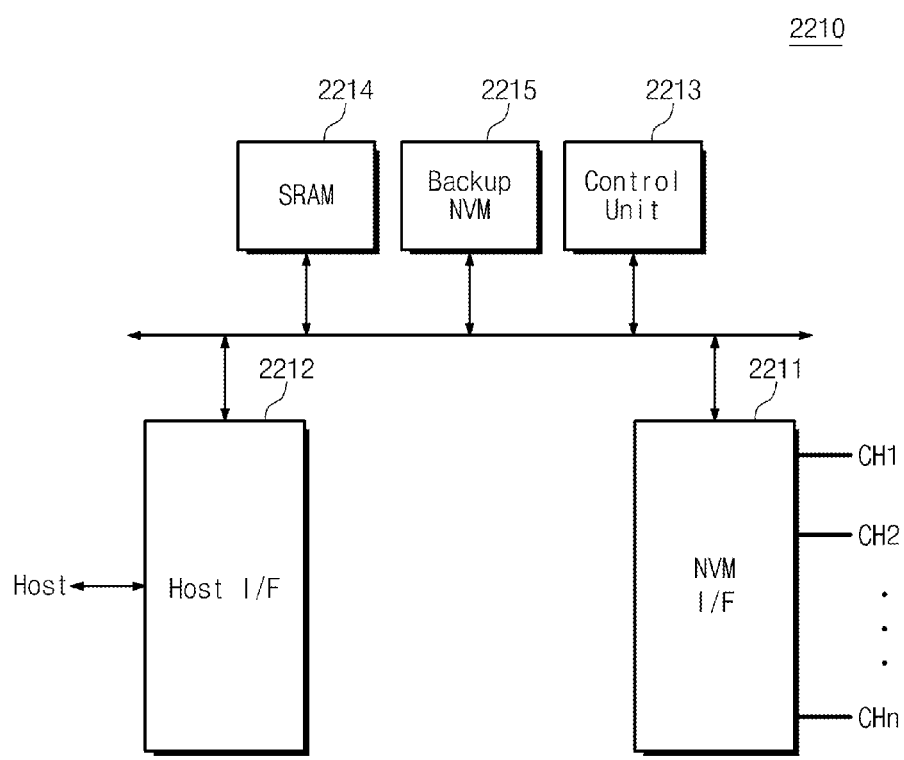
FIG. 9 is a block diagram illustrating an example of an SSD controller shown in FIG. 8, according to an embodiment of the inventive concept.

Reference is made to FIG. 9, which is a block diagram illustrating an exemplary configuration of the SSD controller 2210 shown in FIG. 8. The SSD controller 2210 includes a nonvolatile memory (NVM) interface 2211, a host interface 2212, a control unit 2213, SRAM 2213, and backup nonvolatile memory 2215.

The NVM interface 2211 scatters data transmitted from a main memory of the host 2100 to respective channels CH1~CHn. Also the NVM interface 2211 transmits data read from the nonvolatile memories 2201~220$n$ to the host 2100 via the host interface 2212.

The host interface 2212 provides an interface with the SSD 2200 in response to a protocol of the host 2100. The host interface 2212 may communicate with the host 2100 using any of a variety of interface specifications, such as Universal Serial Bus (USB), Small Computer System Interface (SCSI), PCI Express (PIC-E), Advanced Technology Attachment (ATA), Parallel AT Attachment (PATA), Serial AT Attachment (SATA) or Serial Attached SCSI (SAS). Moreover, the host interface 2212 may perform a disk emulation function that provides aid for the host to recognize the SSD 2200 as a Hard Disk Drive (HDD).

The control unit 2213 analyses and processes the signal SGL input from the host 2100. The control unit 2213 controls the host 2100 or the nonvolatile memories 2201~220$n$ through the host interface 2212 or the NVM interface 2211, respectively. The control unit 2213 controls the operation of the nonvolatile memories 2201~220$n$ according to firmware for driving the SSD 2200.

The SRAM 2214 may be used to drive software S/W used for efficient management of the nonvolatile memories 2201~220$n$. Also the SRAM 2214 may store meta data input from a main memory of the host 2100 or store cache data. During sudden power-off, the meta data or the cache data stored in the SRAM 2214 may be stored in the nonvolatile memories 2201~220$n$ by using auxiliary power supply 2220.

Referring again to FIG. 8, the SSD system 2000 may perform erasure decoding by transmitting only one data stream to the SSD controller 2210 from the nonvolatile memories 2201~220$n$ during reading of the data stored in the nonvolatile memories 2201~220$n$, according to various embodiments.

In FIGS. 8 and 9, the SRAM 2214 may be replaced with a nonvolatile memory. That is, the SSD system 2000 according to another embodiment of the inventive concept, may be implemented such that the role of the SRAM 2214 may be performed by a nonvolatile memory such as a flash memory, a PRAM, an RRAM, and an MRAM.

Figure 10:
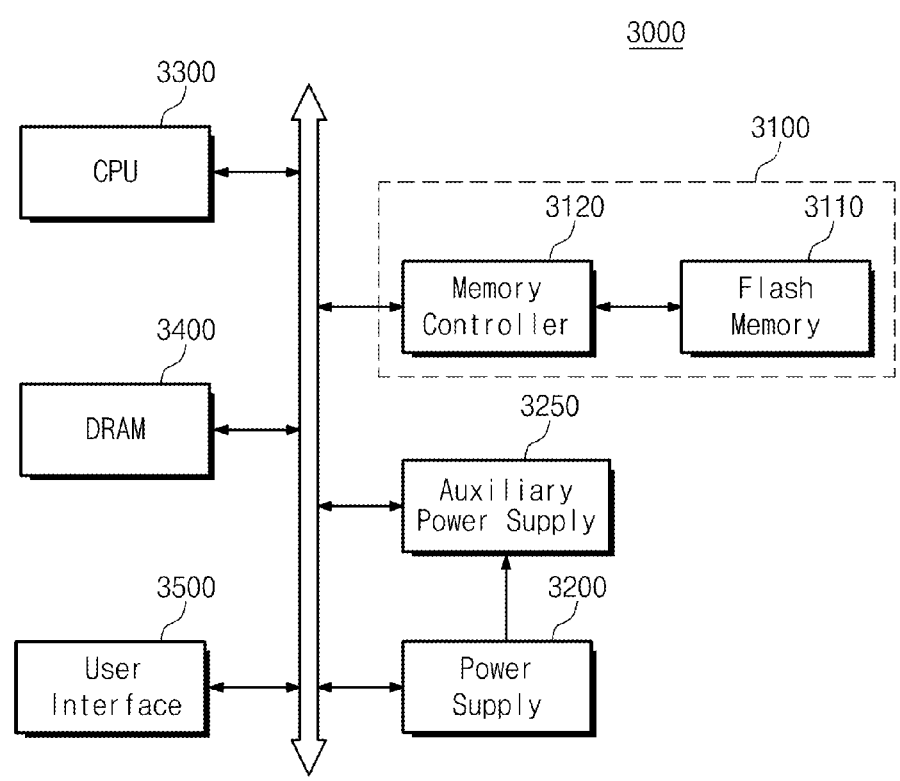
FIG. 10 is a block diagram illustrating a memory device included in an electronic apparatus, according to an embodiment of the inventive concept.

FIG. 10 is a block diagram illustrating an example in which a memory device is implemented in an electronic apparatus 3000, according to an embodiment of the inventive concept. The electronic apparatus 3000 may be implemented in a personal computer (PC) or a portable electronic device, such as a laptop computer, a cellular phone, a personal digital assistant (PDA), or a camera.

The electronic apparatus 3000 includes a memory device 3100, a power supply 3200, an auxiliary power supply 3250, a central processing unit (CPU) 3300, a DRAM 3400, and a user interface 3500. The memory device 3100 includes a flash memory 3110 and a memory controller 3120. The memory device 3100 may be incorporated in the electronic apparatus 3000.

As described above, the electronic apparatus 3000 according to the inventive concept may perform erasure decoding by transmitting only one data stream to the memory controller 3120 from the flash memory 3110 during reading of data stored in the flash memory 3110. Thus, reading time required for the erasure decoding may be reduced.

According to various embodiments described herein, a nonvolatile memory device and a data processing method thereof are able to reduce error correction time.

While the inventive concept has been described with reference to exemplary embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A data processing method for processing data read from a nonvolatile memory, the method comprising:
   receiving erasure location data from the nonvolatile memory at a memory controller; and
   performing erasure decoding based on the erasure location data and pre-read data stored in the memory controller, the erasure location data being the only data stream received from the nonvolatile memory for performing the erasure decoding,
   wherein the erasure location data indicates at least one memory cell of a plurality of memory cells that is erasure, and the pre-read data has been read using a read voltage during previous error correction decoding attempted before receiving the erasure location data.

2. The method as set forth in claim 1, wherein the erasure location data includes a bit indicating each memory cell of the at least one memory cell that is erasure and a bit indicating each memory cell that is not erasure, and wherein the bit indicating each memory cell that is erasure and the bit indicating each memory cell that is not erasure have different logical values.

3. The data processing method as set forth in claim 2, wherein the bit indicating each memory cell that is erasure has a value of "0" and the bit indicating each memory cell that is not erasure has a value of "1."

4. The data processing method as set forth in claim 2, wherein the bit indicating each memory cell that is erasure has a value of "1" and the bit indicating each memory cell that is not erasure has a value of "0."

5. The data processing method as set forth in claim 1, wherein performing erasure decoding comprises:
   generating erasure defined data based on the erasure location data and the pre-read data stored in the memory controller; and
   generating erasure decoded data from the erasure defined data using a decision algorithm.

6. The data processing method as set forth in claim 5, further comprising:
   performing error correction on the erasure decoded data.

7. The data processing method as set forth in claim 6, wherein generating the erasure decoded data comprises converting all erasure bits of the erasure location data into the same logical value, the error correction being performed on the converted erasure bits.

8. The data processing method as set forth in claim 6, wherein generating the erasure decoded data comprises weighting each bit of the erasure defined data according to a log-likelihood ratio, the error correction being performed on the weighted erasure defined data.

9. A data processing method for processing data read from a nonvolatile memory, comprising:
   determining whether a read voltage used during previous error correction decoding is within a range of erasure threshold voltages;
   providing erasure location data to a memory controller from the nonvolatile memory when the read voltage is within the range of the erasure threshold voltages; and
   performing erasure decoding based on the erasure location data and pre-read data stored in the memory controller when the read voltage is within the range of the erasure threshold voltages, the erasure location data being the only data stream received from the nonvolatile memory for performing the erasure decoding,
   wherein the erasure location data indicates at least one memory cell of a plurality of memory cells that is erasure, and the stored pre-read data is read in correspondence to the read voltage during the previous error correction decoding.

10. The data processing method as set forth in claim 9, further comprising:
    performing erasure decoding based on the erasure location data and pre-read data when the read voltage is not within the range of the erasure threshold voltages.

11. The data processing method as set forth in claim 9, wherein the erasure location data is read data using a lowest voltage of the range of erasure threshold voltages when a difference between the read voltage and a highest voltage of the range of erasure threshold voltages is within a reference value.

12. The data processing method as set forth in claim 9, wherein the erasure location data is read data using a highest voltage of the range of erasure threshold voltages when a difference between the read voltage and a lowest voltage of the range of erasure threshold voltages is within a reference value.

13. A nonvolatile memory device comprising:
    a nonvolatile memory configured to store data; and
    a memory controller configured to read data from the nonvolatile memory, the memory controller comprising:
       an erasure define unit configured to receive erasure location data including a bit indicating each memory cell of the nonvolatile memory that is erasure and to generate erasure defined data based on the erasure location data and previously stored pre-read bit data; and
       a decision decoder configured to perform decision decoding on the erasure defined data,
    wherein the pre-read data has been read using a read voltage during error correction decoding, and the erasure location data is the only data stream received by the memory controller from the nonvolatile memory to generate the erasure defined data.

14. The nonvolatile memory device as set forth in claim 13, wherein the decision decoder performs the decision decoding by weighting each bit of the erasure defined data according to a log-likelihood ratio.

15. The nonvolatile memory device as set forth in claim 13, wherein the decision decoder performs the decision decoding by converting erasure bits of the erasure defined data into the same logical value.

16. The nonvolatile memory device as set forth in claim 13, wherein the erasure location data further includes a bit indicating each memory cell of the nonvolatile memory that is not erasure, wherein the bit indicating each memory cell that is erasure and the bit indicating each memory cell that is not erasure have different logical values.

17. The nonvolatile memory device as set forth in claim 13, wherein the memory controller receives the erasure location data from the nonvolatile memory device as a result of a comparison between the read voltage and a range of erasure threshold voltages during the error correction decoding.

18. The nonvolatile memory device as set forth in claim 17, wherein the memory controller receives only the erasure location data from the nonvolatile memory when the read voltage is within the range of the erasure threshold voltages.

19. The nonvolatile memory device as set forth in claim 17, wherein the memory controller receives additional erasure location data from the nonvolatile memory when the read voltage is not within the range of the erasure threshold voltages, wherein the erasure location data is read using a highest voltage of the range of erasure threshold voltages, and the additional erasure location data is read using a lowest voltage of the range of erasure threshold voltages, and wherein the erasure defined data is generated based on the erasure location data and the additional erasure location data.

20. The nonvolatile memory device as set forth in claim 13, wherein the decision decoder is further configured to perform error correction on the erasure decoded data.

* * * * *